United States Patent [19]

Opresko

[11] Patent Number: 4,898,746

[45] Date of Patent: Feb. 6, 1990

[54] MATERIAL DEPOSITION PROCESS ANALYSIS SYSTEM

[75] Inventor: Stephen T. Opresko, Lancaster, Pa.

[73] Assignee: RCA Licensing Corporation, Princeton, N.J.

[21] Appl. No.: 213,214

[22] Filed: Jun. 28, 1988

[51] Int. Cl.$^4$ .............................................. D05D 5/06
[52] U.S. Cl. ....................................... 427/10; 427/69; 427/250
[58] Field of Search ............................. 427/69, 9, 250

[56] References Cited

U.S. PATENT DOCUMENTS

| | | | |
|---|---|---|---|
| 3,067,055 | 12/1962 | Saulnier, Jr. | 117/33.5 |
| 3,582,394 | 6/1971 | Salveter, Jr. | 117/97 |
| 4,051,270 | 9/1977 | Butler | 427/9 |

FOREIGN PATENT DOCUMENTS

| | | | |
|---|---|---|---|
| 0166960 | 1/1986 | European Pat. Off. | 427/9 |
| 0166991 | 1/1986 | European Pat. Off. | 427/9 |

OTHER PUBLICATIONS

U.S. Pat. Application, Ser. No. 132,516 filed on 12/14/87 by Stephen Thomas Opresko titled, Apparatus for Controlling the Distribution of Evaporated Material onto a Surface.

Primary Examiner—Janyce Bell
Attorney, Agent, or Firm—Joseph S. Tripoli; Dennis H. Irlbeck; Vincent J. Coughlin, Jr.

[57] ABSTRACT

A system for analyzing an aluminum deposition process to form a coating on a surface of a CRT faceplate panel disposed on an exhaust cart includes: an apparatus within the exhaust cart for controlling the distribution of the aluminum; a sensor disposed on the panel for determining whether aluminum was deposited thereon, and a plurality of thickness monitors disposed on the panel for generating a plurality of signals representative of the relative thickness of the aluminum coating at a plurality of locations on the surface thereof. The signals are converted into data values to indicate whether the aluminum coating achieves a predetermined thickness profile.

A method of depositing the aluminum coating is also disclosed. The method provides an indication of the performance of each of the exhaust carts and permits the categorization of defects for the panels not meeting the predetermined thickness profile.

2 Claims, 6 Drawing Sheets

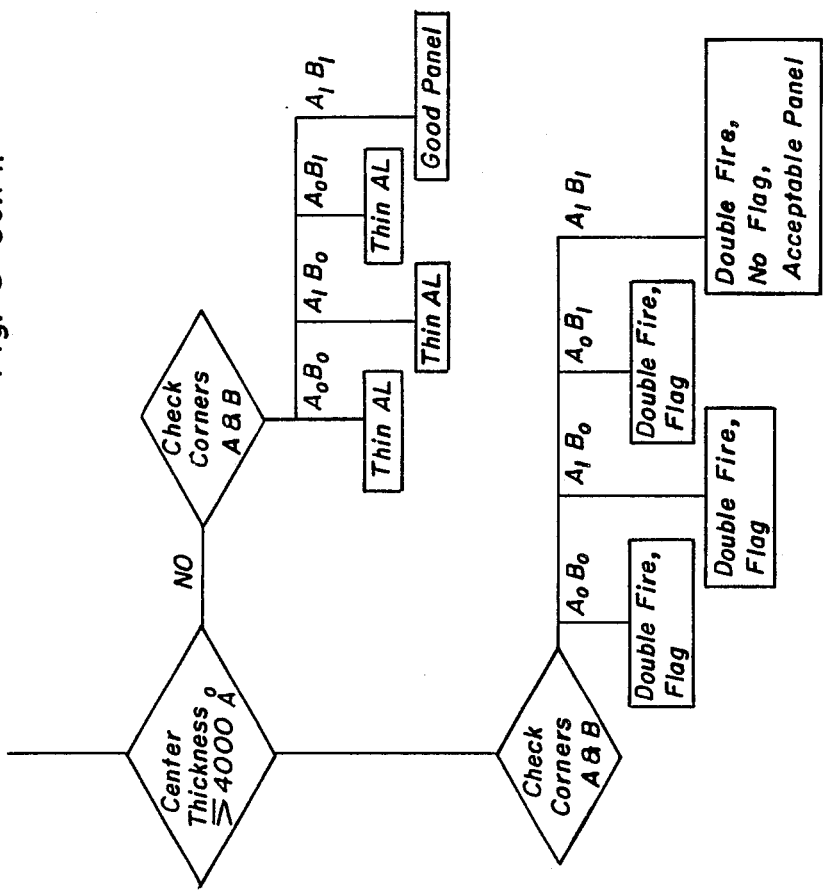
Fig. 3 Con't.

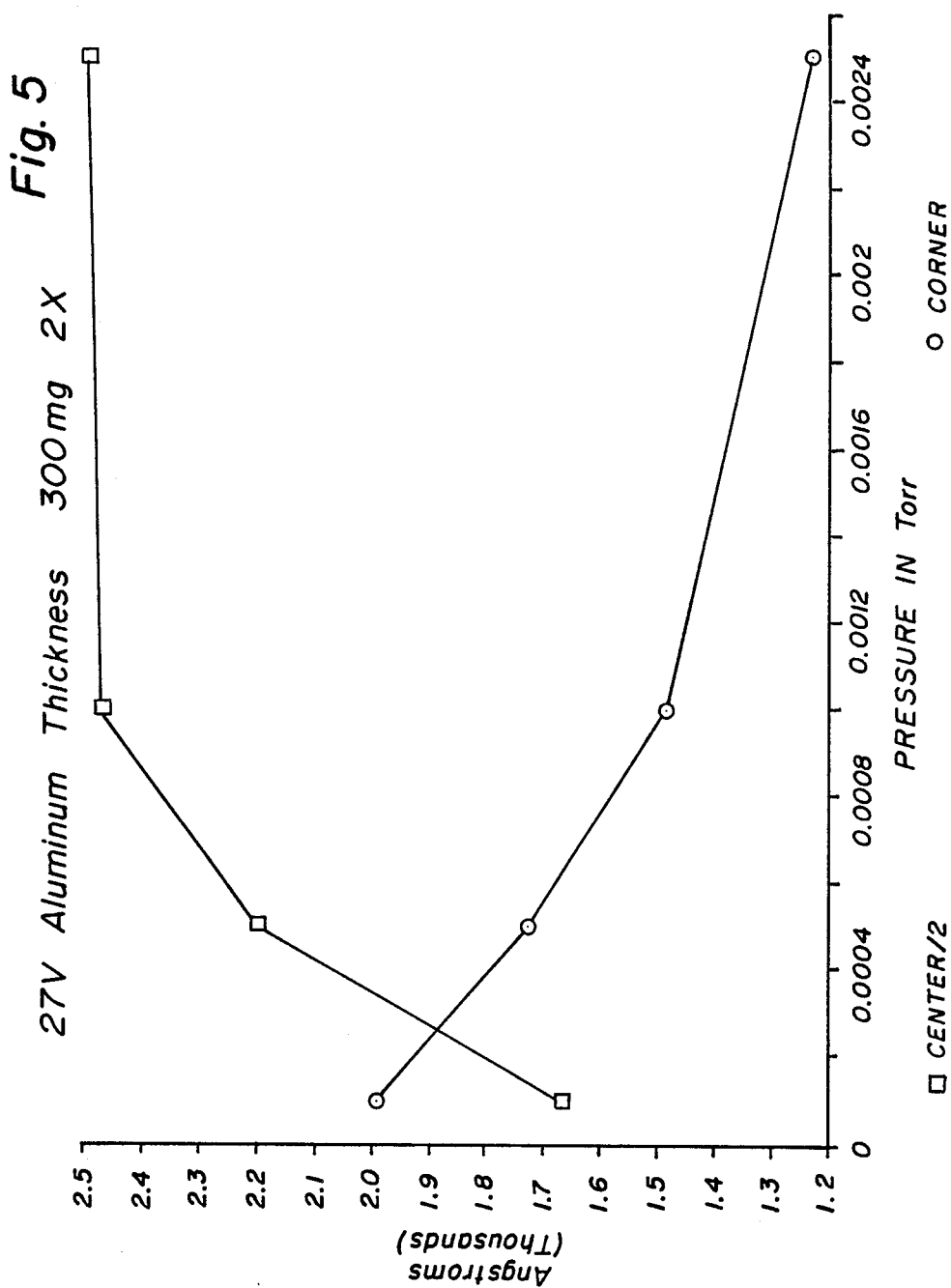

MATERIAL DEPOSITION PROCESS ANALYSIS SYSTEM

BACKGROUND OF THE INVENTION

The invention relates generally to a system for analyzing a sputtered or evaporated material deposition process onto a surface of an object, and particularly to such a system for aluminizing the inside surface of a cathode-ray tube (CRT) faceplate panel disposed on an exhaust cart and for determining the aluminum layer thickness profile and exhaust cart operating performance.

An image is produced on the inside surface of a cathode-ray tube (CRT), or picture tube for a color television set, by scanning a phosphor coating on the inside surface of the tube with an electron beam. The impact of the electrons on the phosphor materials causes the phosphors to luminesce and emit the light necessary to produce the image. In order to attract electrons to the phosphor screen it is necessary to place a voltage on the screen. This is accomplished by evaporating a thin layer of conductive material, such as aluminum, over the phosphor coating on the screen. The scanning electron beams which generate the image must penetrate the aluminum layer in order to cause the phosphors to luminesce. For this reason, it is important that the thickness of the aluminum coating across the screen be fairly uniform in order to prevent variations in the light output of the tube.

Typically, the aluminum is distributed onto the phosphor screen by placing the faceplate panel carrying the screen onto an exhaust cart which includes a vacuum pump and a source of aluminum. The aluminum is provided in one or more heaters or sputter sources which cause the aluminum to coat the screen. Typically, when evaporating a layer of material on a large surface, the thickness distribution of the coating material is a function of the number of evaporation sources, the location of the sources with respect to the surface being coated, vacuum conditions within the exhaust cart, and the size of the panel being coated. In an evaporation system the evaporation material is replenished for each evaporation. Therefore, it is desirable to have the fewest number of sources while still obtaining an acceptable distribution on the surface. A single source is not practical because experiments have shown that it is not effective for large rectangular surfaces. Four sources usually suffice if the sources are properly positioned. However, this is disadvantageous because the number of sources increases the needed maintenance, the functions to be performed by the operator and the expense of the operation. Two sources are preferred, and an apparatus for controlling the distribution of evaporated aluminum from two sources onto a screen formed on the inside surface of a panel is described in my copending U.S. Patent Application, Ser. No. 132,516 filed on Dec. 14, 1987.

In some prior art evaporation systems the ratio of the thickest portion of the coated film to the thinnest portion of the film is between 4:1 and 5:1. Thickness ratios of this order are unacceptable for most large CRT's, and particularly for color picture tubes, because changes of this order in the thickness of the evaporated layer cause too great of a variation in the light output across the tube. The apparatus described in U.S. Patent Application Ser. No. 132,516 usually provides a controlled distribution of evaporated material within acceptable limits; however, there is a need to identify, on line, panels having coatings that are too thick or too thin because of either operator error or exhaust cart malfunction.

SUMMARY OF THE INVENTION

A system for analyzing a material deposition process for forming a coating on a surface of an object disposed on exhaust means includes: means for controlling the distribution of the material; means for determining the operating condition of the exhaust means; and means for generating a plurality of signals representative of the relative thickness of the coating formed by the deposition of the material at a plurality of locations on the surface of the object. Means also are provided for converting the signals into data values to indicate whether the coating achieves a predetermined thickness profile.

BRIEF DESCRIPTION OF THE DRAWINGS

FIG. 5 shows the same relationship as shown in FIG. 4 except that the panel is aluminized twice.

DETAILED DESCRIPTION OF THE PREFERRED EMBODIMENT

Figure 1:
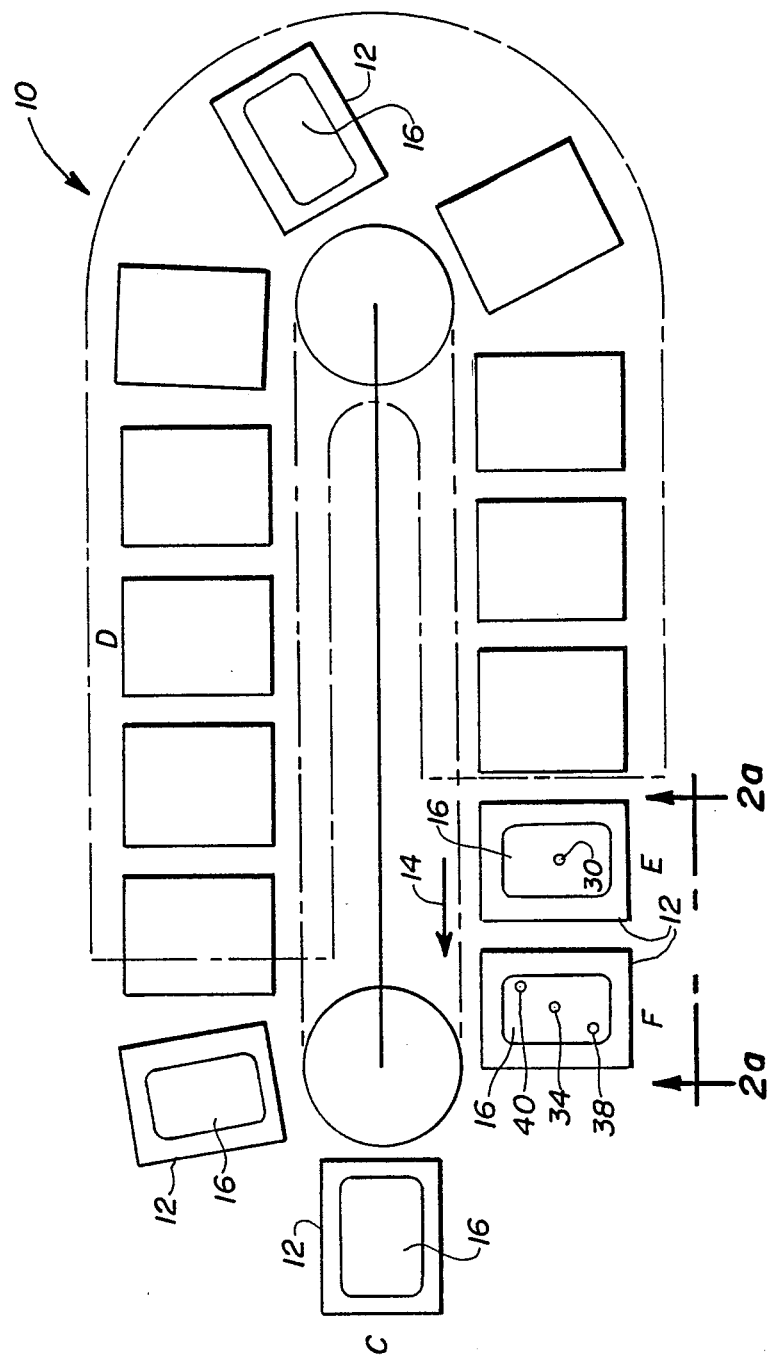
FIG. 1 is a simplified showing of a carrousel aluminizer incorporating a preferred embodiment of the present invention.

In FIG. 1, a carrousel aluminizer 10 includes a plurality of exhaust carts 12 each of which moves incrementally about the carrousel as indicated by arrow 14, carrying a faceplate panel 16. The exhaust carts 12 are incremented to the various positions indicated generally as C (panel load/unload), D (evacuate), E (aluminize), and F (measure thickness) where the production steps are performed. At position C, the panel 16 is loaded onto the exhaust cart 12.

In FIG. 2a, a portion of vacuum chamber 18 is shown in phantom at aluminizing station E. The vacuum chamber is closed at one end by the faceplate panel 16. A phosphor screen 20, shown in FIG. 2b, is disposed on an inner surface 22 of the panel 16. An evaporated material distribution apparatus 24, of the type described in copending U.S. Patent Application Ser. No. 132,516, is disposed within the vacuum chamber 18. A plurality of heaters 26, preferably two heaters, are spaced a preselected distance apart for evaporating material, e.g., aluminum. The apparatus 24 controls the distribution of the evaporated material to provide a sufficiently uniform deposition of a layer 28 of aluminum on the phosphor screen 20. A firing sensor 30 positioned on the outside surface of the faceplate panel 16 determines whether the heaters 26 have been activated to evaporate the aluminum onto the phosphor screen. The output of the sensor 30 may be provided to a monitor lamp or check-fire indicator 32 on the exhaust cart 12 to permit the system operator to determine whether the aluminizing step has been completed. A drawback of the sensor 30 is that it cannot discriminate between the normal condition when both heaters 26 are energized to evaporate aluminum and an abnormal condition when only one of the heaters is energized or, when, through operator error, aluminum material is not loaded into one or both heaters.

The above described problems of equipment malfunction and/or operator error are sensed and analyzed at position F by a plurality of conventional thickness monitors 34, 38 and 40 which convert electrical signals into data values which indicate the aluminum coating thickness profile at the center and edges of the panel. These data values are recorded and stored, e.g., in a computer, and utilized to analyze the aluminizing process and to identify exhaust carts in need of maintenance and repair. Also at position F, the cart number and the operating positions of the various process controls on the cart are recorded. Additionally, the exhaust cart 12 includes a reride sensor and switch 36 which indicates whether the panel previously has been cycled around the carrousel, e.g., to realuminize a panel that had an unacceptably thin coating 28 after the initial aluminizing step.

Figure 2:
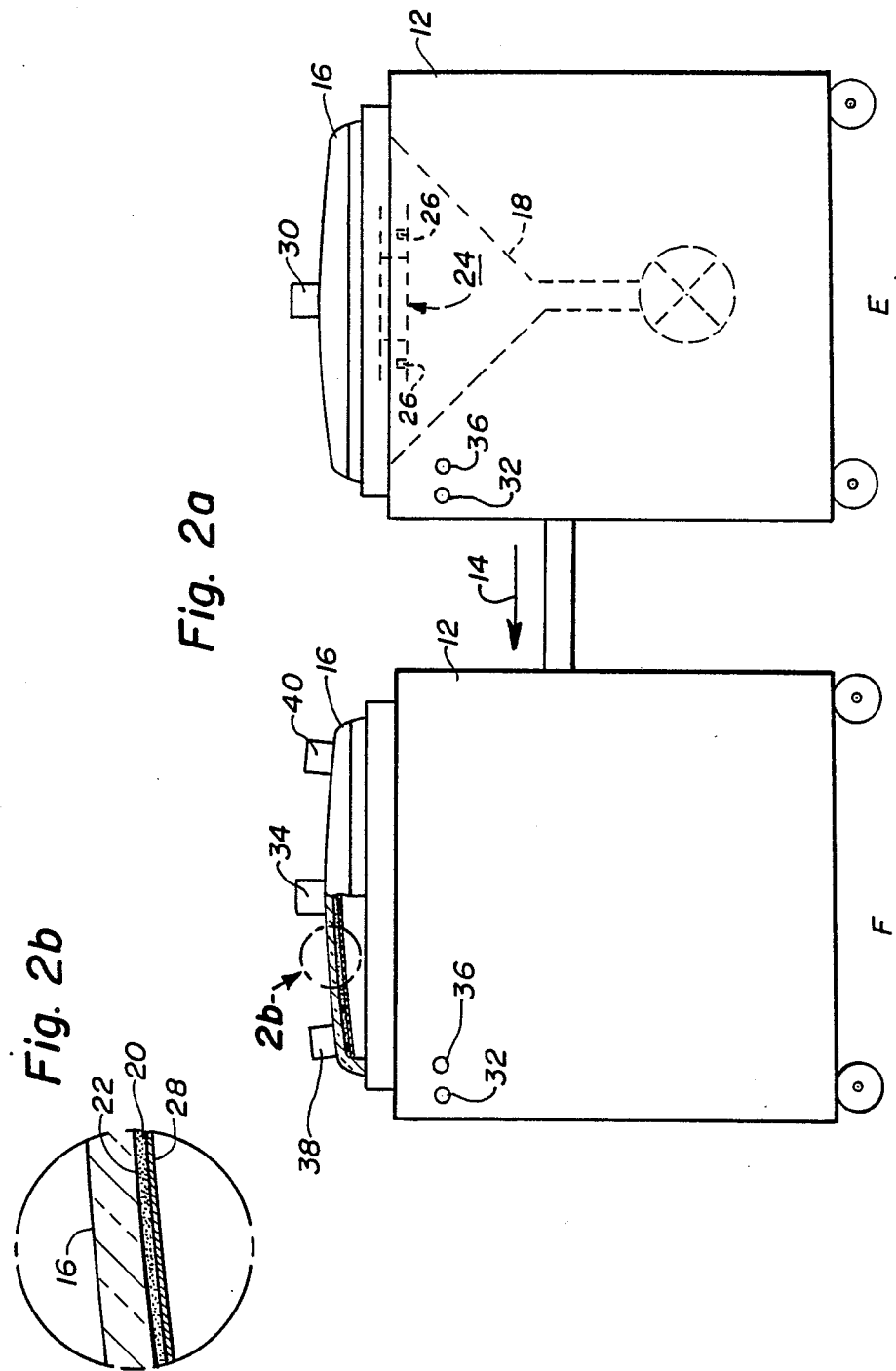
FIG. 2a is a front view of two exhaust carts located at two processing positions of the carrousel aluminizer shown in FIG. 1.
FIG. 2b is a segment of a faceplate of a CRT made according to the present invention.
Figure 3:
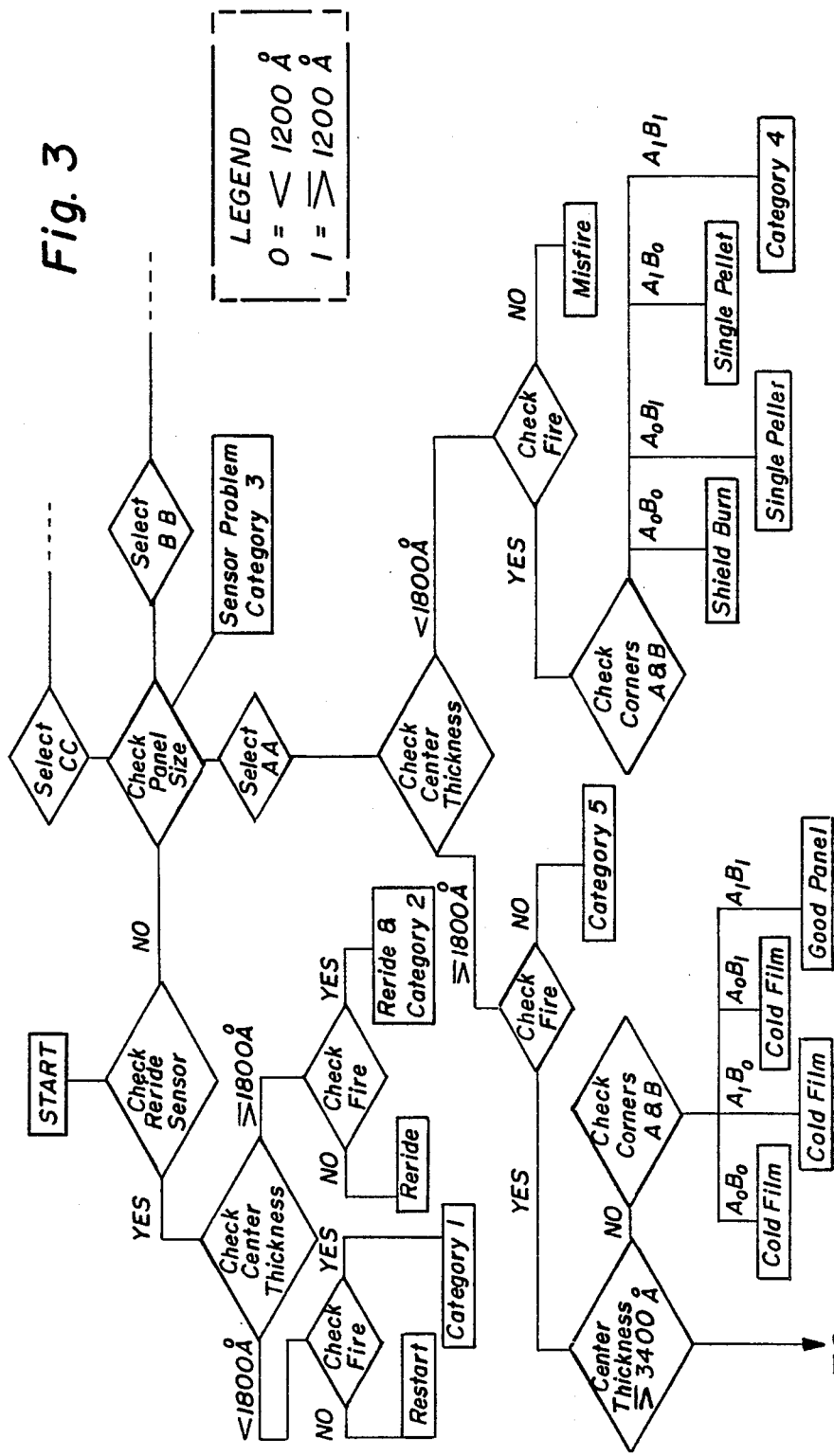
FIG. 3 is a flow chart of a preferred embodiment of a method for processing a faceplate panel according to the present invention.

The operation of the system can be understood by referring to FIGS. 1, 2 and 3. The number of the exhaust cart 12 is recorded, e.g. from a bar code (not shown) affixed to the cart, at location F. The reride sensor and switch 36 on the cart is checked and its position (yes/no) is recorded. If the reride sensor indicates "yes" and if the panel has been aluminized, the center thickness of the aluminum is determined from the output of the center thickness monitor 34. The position (yes/no) of the check-fire indicator 32 is recorded. If the thickness of the aluminum layer 28 is less than 1800 angstroms (Å) and the check-fire indicator 32 is in the "no" position, the system is in a normal restart mode after a shutdown and the panel has not been aluminized. However, if the reride sensor indicates "yes" and if the check-fire indicator 32 is in the "yes" position and the aluminum thickness on the center monitor 34 is less than 1800 Å, an equipment problem with the firing sensor 30 or the thickness sensor 24 (category 1) has occurred. If the center thickness monitor 34 indicates a thickness of 1800 Å or greater, and the check-fire indicator 32 is in the "no" position, the panel is a "reride", i.e., the panel has been previously aluminized. If the check-fire indicator 32 is in the "yes" position and the center thickness is 1800 Å or greater an equipment problem with the firing sensor 30 (category 2) has occurred. In each instance where the reride sensor 36 is in the "yes" position, the thickness readings are not recorded for the purpose of determining a five-fold average. A five-fold average is defined as the average of the center divided by the average corner thickness ratios for five aluminized panels of the same size.

Where the reride sensor 36 is in the "no" position at position "F", the previously aluminized panel is unloaded from the exhaust cart 12 and a new panel 16 having a phosphor screen 20 thereon is loaded onto the cart and the cart number is recorded. An aluminum pellet (not shown) is placed into each of the heaters 26 before the new panel is loaded on the cart. The panel size also is recorded. The cart 12 can be adapted to process panels ranging in size from 19 inch (19V) to 35 inch (35V). If the panel sensor (FIG. 3) indicates an incorrect panel size this is a panel sensor failure problem (category 3). For purpose of example, the process will be described with respect to a 27 inch (27V) panel (program AA). For convenience, the oppositely disposed corners of the panel are identified as locations "A" and "B". The thickness of the aluminum coating 28 at the corners is indicated by the notation $0 = <1200$ Å, and $1 = \geq 1200$ Å. For example, the notation $A_oB_1$ means that the thickness of the aluminum coating at corner location A is less than 1200 Å, and equal to or greater than 1200 Å at corner location B.

The panels 12 are transported around the carrousel 10, through area "D" during which time the volume defined by the vacuum chamber 18 and the faceplate 16 is evacuated to a suitable low pressure. At position "E" the sensor 30 is located on the center of the faceplate 16 and a voltage is applied to the heaters 26 to evaporate the solid (aluminum) material held within the heaters. The distribution controller 24 selectively inhibits the flow of the evaporated material as described in U.S. Patent Application Ser. No. 132,516 referenced above, to provide the substantially uniform layer 28 of aluminum metal on the phosphor screen 20. At position "F" three eddy current thickness monitors 34, 38 and 40 are positioned on the outside surface of the faceplate 16 at the center and diagonally opposite corners, respectively. While three locations are monitored, it should be clear to one skilled in the art that the other locations may also be monitored. With reference to FIGURE 3, for a non-reride panel (reride sensor "no"), the panel size is determined and the center thickness of the aluminum layer is measured. If the center thickness is less than 1800 Å and the check-fire indicator 32 is in the "no" position there has been a "misfire" and the panel is recycled once more around the carrousel. However, if the check-fire indicator 32 is in the "yes" position, the corner aluminum thickness readings are determined. If either or both of the corner thickness readings are less than 1200 Å (i.e., $A_oB_o$, $A_1B_o$ or $A_oB_1$) this usually indicates an operator error of only loading an aluminum pellet into one of the heaters 26, or omission of both aluminum pellets. If, however, the corner thickness readings are equal to or greater than 1200 Å when the center thickness reading is less than 1800 Å, experience indicates that a calibration problem or malfunction of one or more of the thickness monitors 34, 38 and 40 has occurred (category 4).

When the center thickness monitor 34 indicates an aluminum layer 28 having a thickness of 1800 Å or greater and the check-fire indicator 32 is in the "no" position, the firing sensor 30 has malfunctioned (category 5). However, if the check-fire indicator 32 is in the "yes" position and the center thickness monitor 34 indicates an aluminum thickness of between 1800 Å and less than 3400 Å the corner thickness A and B are determined by thickness monitors 38 and 40. If either or both of the corner aluminum thickness readings are less than 1200 Å (i.e., $A_oB_o$, $A_1B_o$ or $A_oB_1$) then, a prior film (not shown), deposited on the phosphor layer, is irregular in contour, i.e., a "cold film", and the panel is rejected. However, if the corner thickness readings are equal to or greater than 1200 Å ($A_1B_1$), the panel is a good panel. The average aluminum thickness of the good panel, calculated as, center/((A+B)/2), is recorded in the five-fold average.

If the center aluminum thickness is at least 3400 Å but less than 4000 Å and the aluminum thickness of either or both corners is less than 1200 Å (i.e., $A_oB_o$, $A_1B_o$ or $A_oB_1$) then the panel is rejected for a thin (corner) aluminum layer. A good panel will have an aluminum thickness in both corners of 1200 Å or greater ($A_1B_1$). In either case, the average aluminum thickness, center/-$((A+B)/2)$ is used in the five fold average.

If the center aluminum thickness is 4000 Å or greater and if either or both corners have an aluminum thickness of less than 1200 Å (i.e. $A_oB_o$, $A_1B_o$, or $A_oB_1$) then the panels are rejected as "double fire" meaning that the panel was aluminized twice without achieving the proper (corner) thickness. The exhaust cart is "flagged", meaning it has a problem, and the thickness is entered into the five-fold average for that cart as a 5:1 ratio. However, if the aluminum thickness in both corners is 1200 Å or more ($A_1B_1$) the panel is a double fired panel and the average thickness, center/$((A+B)/2)$, is used in the five fold average.

Figure 4:
FIG. 4 shows the relationship of deposited aluminum thickness versus pressure at the center and edges of a 27V faceplate panel for a single aluminum evaporation cycle.

FIG. 4 shows curves of aluminum thickness and evacuation pressure for a 27V panel aluminized once with a total of about 600 milligrams (mg) of aluminum (typically 300 mg/source). For convenience, the center aluminum thickness has been divided by 2 for ease of comparison. In other words, the actual center thickness of the aluminum layer 28 is double the thickness shown in FIG. 4. The figure shows that the ratio =center thickness /$((A+B)/2)$ increases as the pressure of the exhaust cart degrades (increases). Thus, by consulting the ratio calculated for the panels made on each exhaust cart it is possible to predict when the cart will require vacuum pump maintenance before it begins to produce unacceptable panels.

Additionally, by analyzing the defective panels produced on the carts and noting the positions of the process switches (reride sensor and check file) and the aluminum layer thickness of the center and corner positions, the nature of the defect problems - either equipment malfunction, operator error, or defective prior process step - can be determined and corrected.

FIG. 5 shows curves of aluminum thickness and evacuation pressure for panels aluminized twice, each with 300 mg. of aluminum per source (1200 mg. total). The relative center-to-corner ratios are substantially greater than for panels aluminized once. Thus, while the ratios are an important indicator of exhaust cart performance, it is also necessary to know whether the panel is a "reride", i.e., a panel aluminized twice, or a panel that was aluminized only once.

While the invention is described with reference to a 27V faceplate panel, the invention may be utilized on any panel size, e.g., programs BB, CC, etc., as indicated in FIG. 3. For other panel sizes, the aluminum thickness values for the center and the corners will vary from those expressed herein; however, the process and method is similar to that claimed.

What is claimed is:

1. A method for depositing an aluminum coating on a phosphor screen of a CRT faceplate panel, comprising the steps of:
   a. loading said panel onto an identified exhaust cart having an evacuation chamber with an apparatus therein for controlling the distribution of aluminum from at least one source on said apparatus;
   b. evacuating said chamber to a pressure sufficient to deposit aluminum;
   c. providing aluminum from said source and depositing aluminum as a coating on said phosphor screen of said panel;
   d. sensing the providing of said aluminum from said source;
   e. generating a plurality of electrical signals representative of the relative thickness of said aluminum coating at the center and the edges on said panel; and
   f. converting said signals into data values to indicate whether said aluminum coating achieves a predetermined thickness profile and utilizing said data values to provide an indication of the performance of said identified exhaust cart and of the categories of defects for said panel not meeting said predetermined thickness profile.

2. A method for depositing an aluminum coating on a phosphor screen of a CRT faceplate panel, comprising the steps of:
   a. loading said panel onto an identified exhaust cart having an evacuation chamber with an apparatus therein for controlling the distribution of aluminum from two sources on said apparatus;
   b. evacuating said chamber to a pressure sufficient to deposit aluminum;
   c. providing aluminum from said sources and depositing aluminum as a coating on said phosphor screen of said panel;
   d. sensing the providing of said aluminum from said sources;
   e. generating a plurality of electrical signals, by thickness monitors, representative of the relative thickness of said aluminum coating at the center and at diagonally opposite corners on said panel; and
   f. converting said signals into data values to indicate whether said aluminum coating achieves a predetermined thickness profile and utilizing said data values to provide an indication of the performance of said identified exhaust cart and of the categories of defects for said panel not meeting said predetermined thickness profile.

* * * * *